US009946290B2

(12) United States Patent
Kim et al.

(10) Patent No.: US 9,946,290 B2
(45) Date of Patent: Apr. 17, 2018

(54) CURRENT REFERENCE CIRCUIT AND AN ELECTRONIC DEVICE INCLUDING THE SAME

(71) Applicant: SAMSUNG ELECTRONICS CO., LTD., Suwon-si, Gyeonggi-do (KR)

(72) Inventors: Sung-Jin Kim, Ulsan (KR); Tae-Ik Kim, Seongnam-si (KR); Ji-Hyun Kim, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/236,931

(22) Filed: Aug. 15, 2016

(65) Prior Publication Data

US 2017/0060165 A1 Mar. 2, 2017

(30) Foreign Application Priority Data

Aug. 31, 2015 (KR) ........................ 10-2015-0123013

(51) Int. Cl.

| | |
|---|---|
| ***H03L 7/08*** | (2006.01) |
| ***G05F 1/46*** | (2006.01) |
| ***G05F 1/575*** | (2006.01) |
| ***G05F 1/08*** | (2006.01) |
| ***G05F 1/02*** | (2006.01) |
| ***G05F 3/26*** | (2006.01) |

(52) U.S. Cl.
CPC .................................... *G05F 3/262* (2013.01)

(58) Field of Classification Search
CPC . G05F 1/462; G05F 1/575; G05F 3/08; G05F 3/02; G05F 3/242; G05F 1/46; H03L 7/0805; H03L 7/085; H03L 7/0995
See application file for complete search history.

(56) References Cited

U.S. PATENT DOCUMENTS 4,862,015 A * 8/1989 Grandfield .............. G05F 1/466 323/315
5,144,156 A 9/1992 Kawasaki
5,359,298 A 10/1994 Abe
5,638,014 A * 6/1997 Kurita .................. H03K 3/0231 327/141

(Continued)

FOREIGN PATENT DOCUMENTS

| | | |
|---|---|---|
| JP | 2000-049597 | 2/2000 |
| JP | 4134712 | 6/2008 |
| KR | 100495304 | 6/2005 |
| KR | 1020070074698 | 7/2007 |

*Primary Examiner* — Timothy J Dole
*Assistant Examiner* — Sisay G Tiku
(74) *Attorney, Agent, or Firm* — F. Chau & Associates, LLC

(57) ABSTRACT

A current reference circuit includes a reference current supply unit configured to generate a reference current having a target current level, a current-frequency converter configured to receive a first temporary reference current corresponding to the reference current from the reference current supply unit and to generate a first comparison clock signal in response to the first temporary reference current, and a first current compensation unit configured to generate a first current compensation signal used for the first temporary reference current to reach the target current level in response to a frequency of a reference clock signal and a frequency of the first comparison clock signal.

18 Claims, 24 Drawing Sheets

(56) References Cited

U.S. PATENT DOCUMENTS

| | | | | |
|---|---|---|---|---|
| 6,552,579 | B1 | 4/2003 | Knoedgen | |
| 7,277,519 | B2 | 10/2007 | Raha et al. | |
| 7,356,111 | B1 * | 4/2008 | Dean | H03L 7/0996 327/156 |
| 7,733,192 | B2 | 6/2010 | Yamamoto | |
| 7,986,193 | B2 | 7/2011 | Krah | |
| 8,031,027 | B2 | 10/2011 | Park et al. | |
| 8,212,599 | B2 | 7/2012 | Bhuiyan et al. | |
| 9,244,485 | B1 * | 1/2016 | Koh | G06F 1/08 |
| 2006/0063502 | A1 * | 3/2006 | Shibuya | H03L 7/02 455/255 |
| 2008/0068091 | A1 * | 3/2008 | Kwan | H03L 7/00 331/16 |
| 2008/0157882 | A1 * | 7/2008 | Krah | G06F 3/0416 331/18 |
| 2010/0207694 | A1 * | 8/2010 | Miyata | H03L 5/00 331/25 |
| 2011/0115570 | A1 * | 5/2011 | Chang | H03L 1/00 331/1 R |
| 2011/0156760 | A1 * | 6/2011 | Bhuiyan | H03K 3/011 327/102 |
| 2013/0181760 | A1 * | 7/2013 | Lin | H03K 3/011 327/299 |
| 2015/0026847 | A1 | 1/2015 | Pai et al. | |
| 2016/0065220 | A1 * | 3/2016 | Rana | H03K 3/0315 331/1 R |
| 2016/0070294 | A1 * | 3/2016 | Chung | G06F 1/04 345/213 |

* cited by examiner

FIG. 13

| | F1 | $F_{CV\_R}$ | ICS_R |
|---|---|---|---|
| FLL1 | 100 | 10 | 000011 |
| FLL2 | 100 | 40 | 001111 |
| FLL3 | 100 | 120 | 000111 |
| FLL4 | 100 | 100 | 000111 |

FIG. 14

| | F2 | $F_{CV}$ | ICS |
|---|---|---|---|
| CLL1 | 200 | 110 | 000011 |
| CLL2 | 200 | 140 | 000111 |
| CLL3 | 200 | 170 | 001111 |
| CLL4 | 200 | 200 | 001111 |

CURRENT REFERENCE CIRCUIT AND AN ELECTRONIC DEVICE INCLUDING THE SAME

CROSS-REFERENCE TO RELATED APPLICATION

This application claims priority under 35 U.S.C. § 119 to Korean Patent Application No. 10-2015-0123013, filed on Aug. 31, 2015, in the Korean Intellectual Property Office, the disclosure of which is incorporated by reference herein in its entirety.

TECHNICAL FIELD

The inventive concept relates to a current reference circuit and an electronic device including the same.

DISCUSSION OF THE RELATED ART

A constant reference current, which is generated by a current reference circuit and is not changed by process, voltage, and temperature (PVT) changes, is a main factor used to determine a performance of a whole system. However, as a manufacturing process becomes finer to increase a degree of integration of transistors per unit area, and a source voltage becomes lower, a current reference circuit including a bipolar junction transistor may not be implemented in a low voltage and a high-density design.

SUMMARY

According to an exemplary embodiment of the inventive concept, there is provided a current reference circuit including: a reference current supply unit configured to generate a reference current having a target current level; a current-frequency converter configured to receive a first temporary reference current corresponding to the reference current from the reference current supply unit and to generate a first comparison clock signal, in response to the first temporary reference current; and a first current compensation unit configured to generate a first current compensation signal used for the first temporary reference current to reach the target current level, in response to a frequency of a reference clock signal and a frequency of the first comparison clock signal.

The reference current supply unit may include: a unit current generator configured to generate a unit current for generating the reference current; and a current level adjustor configured to receive the first current compensation signal from the first current compensation unit and to adjust a current level of the first temporary reference current, in response to the first current compensation signal.

The unit current generator may include a beta multiplier reference (BMR) circuit including a complementary metal-oxide semiconductor (CMOS) transistor.

The first current compensation unit may include: a first frequency detector configured to detect the frequency of the first comparison clock signal and the frequency of the reference clock signal; and a first current compensation supply unit configured to compare a level of the frequency of the first comparison clock signal and a level of the frequency of the reference clock signal and to generate the first current compensation signal in response to a result of the comparison.

The first frequency detector may include a frequency divider configured to divide the frequency of the reference clock signal.

The first current compensation signal supply unit may include: a first frequency comparison unit configured to generate a first comparison signal, in response to the comparison result; and a first current compensation signal generator configured to generate the first current compensation signal, in response to the first comparison signal.

The current-frequency converter may include: a frequency locked loop circuit configured to receive a second temporary reference current from the reference current supply unit and generate a frequency locked loop current corresponding to a clock signal having a locked target frequency; and a first current control oscillator configured to obtain a third temporary reference current, by summing the frequency locked loop current and the first temporary reference current and to generate the first comparison clock signal corresponding to the third temporary reference current.

The frequency locked loop circuit may include: a second current control oscillator configured to receive the second temporary reference current and to generate a second comparison clock signal corresponding to the second temporary reference current; and a second current compensation unit configured to receive the reference clock signal and the second comparison clock signal and generate a second current compensation signal in response to the frequency of the reference clock signal and a frequency of the second comparison clock signal.

The second current compensation unit may include: a second frequency detector configured to detect the frequency of the second comparison clock signal and the frequency of the reference clock signal; and a second current compensation supply unit configured to compare a level of the frequency of the second comparison clock signal and a level of the frequency of the reference clock signal and to generate the second current compensation signal in response to a result of the comparison.

A circuit configuration of the first current control oscillator may be the same as a circuit configuration of the second current control oscillator.

The first temporary reference current may correspond to a current which is obtained through a change in the reference current caused by a process, voltage, or temperature (PVT) changes and a current level of the reference current may differ from a current level of the first temporary reference current.

According to an exemplary embodiment of the inventive concept, there is provided an electronic device including: a current reference circuit configured to perform at least one-time current locked loop operation of generating a comparison clock signal based on a temporary reference current and compensating for the temporary reference current by using a frequency of a reference clock signal and a frequency of the comparison clock signal, and generating a reference current corresponding to the compensated temporary reference current; and a function block configured to operate based on the reference current.

The reference clock signal may be received from a crystal oscillator.

The current reference circuit may include a current-frequency converter configured to generate a frequency locked loop current, and generate the comparison clock signal by summing the frequency locked loop current and the temporary reference current.

The current reference circuit may further include a current compensation unit configured to compare a level of a frequency of the reference clock signal and a level of a frequency of the comparison clock signal and to generate a current compensation signal, which is used to compensate for the temporary reference current, based on a result of the comparison.

According to an exemplary embodiment of the inventive concept, there is provided a current reference circuit including: a reference current supply circuit configured to output a reference current and a temporary reference current; a current-frequency converter configured to receive the temporary reference current and a generate a comparison clock signal; and a current compensating circuit configured to receive the comparison clock signal and a reference clock signal, generate a current compensation signal and provide the current compensation signal to the reference current supply circuit.

The comparison clock signal may have a frequency that is controlled according only to a current level of the temporary reference current.

The current compensation circuit may compensate for the temporary reference current to become the reference current based on a frequency of the reference clock signal and a frequency of the comparison clock signal.

The reference current may have a constant current level.

The current reference circuit may be configured to perform a current locked loop operation at least once for the temporary reference current to reach a target level.

BRIEF DESCRIPTION OF THE DRAWINGS

The above and other features of the inventive concept will become more clearly understood by describing in detail exemplary embodiments thereof with reference to the accompanying drawings in which:

FIGS. 13 and 14 are tables for describing an operation of the current reference circuit of FIG. 12 according to an exemplary embodiment of the inventive concept.

DETAILED DESCRIPTION OF THE EMBODIMENTS

Figure 1:
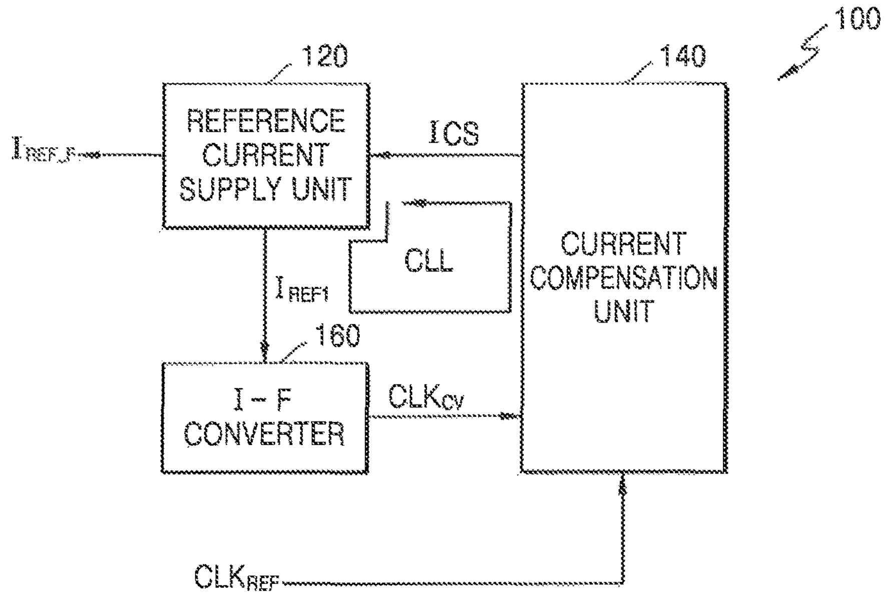
FIG. 1 is a block diagram illustrating a current reference circuit according to an exemplary embodiment of the inventive concept.

Hereinafter, exemplary embodiments of the inventive concept will be described in detail with reference to the accompanying drawings. However, the inventive concept may be embodied in many alternate forms and should not be construed as limited to only the embodiments set forth herein. Like reference numerals may refer to like elements throughout the specification. In the drawings, the dimensions and size of each structure may be exaggerated, reduced, or schematically illustrated for convenience in description and clarity. Elements referred to as units herein may be constituted by a circuit or circuits.

FIG. 1 is a block diagram illustrating a current reference circuit 100 according to an exemplary embodiment of the inventive concept. Referring to FIG. 1, the current reference circuit 100 may include a reference current supply unit 120, a current-frequency (I-F) converter 160, and a current compensation unit 140. The reference current supply unit 120 may supply a reference current $I_{REF\_F}$ corresponding to a target current level to at least one function block integrated into a chip, in order to perform an operation of the function block. The function block may be in the same chip as the current reference circuit 100 or it may be in a chip adjacent to the chip in which the current reference circuit 100 is integrated. The current reference circuit 100 may compensate for a temporary reference current $I_{REF1}$ corresponding to a level to which a current level of the reference current $I_{REF\_F}$ is changed due to process, voltage, and temperature (PVT) changes, in order for the temporary reference current $I_{REF1}$ to reach the target current level. In an exemplary embodiment of the inventive concept, the current reference circuit 100 may perform a current locked loop operation CLL at least once to compensate for the temporary reference current $I_{REF1}$ in order for the temporary reference current $I_{REF1}$ to reach the target current level. A temporary reference current $I_{REF1}$ which has reached the target current level through the current locked loop operation CLL may be supplied as the reference current $I_{REF\_F}$ to the function block. In addition, in an exemplary embodiment of the inventive concept, the reference current supply unit 120 may supply the temporary reference current $I_{REF1}$ to the current-frequency converter 160.

The current-frequency converter 160 may generate a comparison clock signal $CLK_{CV}$, based on the temporary reference current $I_{REF1}$. The current-frequency converter 160 may generate the comparison clock signal $CLK_{CV}$ having a frequency which varies according to a current level of the temporary reference current $I_{REF1}$. The current-frequency converter 160 may perform a frequency loop operation at least once to generate the comparison clock signal $CLK_{CV}$. The generated comparison clock signal $CLK_{CV}$ may have a frequency which is controlled according to only a current level of the temporary reference current $I_{REF1}$ independently from the PVT changes. Details of the frequency loop operation will be described below. The current-frequency converter 160 may supply the generated comparison clock signal $CLK_{CV}$ to the current compensation unit 140.

The current compensation unit 140 may receive a reference clock signal $CLK_{REF}$ from the outside (for example, a reference clock generator disposed outside the current reference circuit 100) and may receive the comparison clock signal $CLK_c$ from the current-frequency converter 160. The reference clock generator may supply the reference clock signal $CLK_{REF}$, which has a constant reference frequency irrespective of the PVT changes, to the current compensation unit 140. In an exemplary embodiment of the inventive concept, the reference clock generator may be a crystal oscillator (e.g., an XTAL oscillator). The current compensation unit 140 may detect a frequency of the reference clock signal $CLK_{REF}$ and a frequency of the comparison clock signal $CLK_{CV}$.

The current compensation unit 140 may compensate for the temporary reference current $I_{REF1}$ in order for the temporary reference current $I_{REF1}$ to become the reference current $I_{REF\_F}$, based on a frequency of the reference clock signal $CLK_{REF}$ and a frequency of the comparison clock signal $CLK_{CV}$. In other words, the current compensation unit 140 may compensate for the temporary reference current $I_{REF1}$ in order for a current level of the temporary reference current $I_{REF1}$ to become equal to that of the reference current $I_{REF\_F}$. In an exemplary embodiment of the inventive concept, the current compensation unit 140 may generate a current compensation signal ICS for compensating for the temporary reference current $I_{REF1}$ and may supply the current compensation signal ICS to the reference current supply unit 120. The current compensation unit 140 may generate the current compensation signal ICS, based on a frequency of the reference clock signal $CLK_{REF}$ and a frequency of the comparison clock signal $CLK_{CV}$. In an exemplary embodiment of the inventive concept, the current compensation unit 140 may compare a level of a frequency of the reference clock signal $CLK_{REF}$ with a level of a frequency of the comparison clock signal $CLK_{CV}$ to generate the current compensation signal ICS, based on a frequency difference therebetween. In an exemplary embodiment of the inventive concept, the current compensation signal may be a digital signal. Details of the current compensation signal will be described below.

The reference current supply unit 120 may receive the current compensation signal ICS and may adjust a current level of the temporary reference current $I_{REF1}$, based on the current compensation signal ICS. Hereinafter, the current compensation unit 140 may be referred to as a first current compensation unit, the temporary reference current $I_{REF1}$ may be referred to as a first temporary reference current, the comparison clock signal $CLK_{CV}$ may be referred to as a first comparison clock signal, and the current compensation signal ICS may be referred to as a first current compensation signal.

The above described series of operations of converting a signal into the comparison clock signal $CLK_{CV}$ having a frequency based on the temporary reference current $I_{REF1}$ and compensating for the temporary reference current $I_{REF1}$ on the basis of the comparison clock signal $CLK_{CV}$ may be referred to as a current locked loop operation. The current reference circuit 100 may perform the current locked loop operation at least once to compensate for the temporary reference current $I_{REF1}$ in order for the temporary reference current $I_{REF1}$ to reach the target current level.

The current-frequency converter 160 may supply the reference current $I_{REF\_F}$, corresponding to a constant current level irrespective of the PVT changes, to the function block and/or the like, based on the comparison clock signal $CLK_{CV}$ which is based on the temporary reference current $I_{REF1}$.

Figure 2:
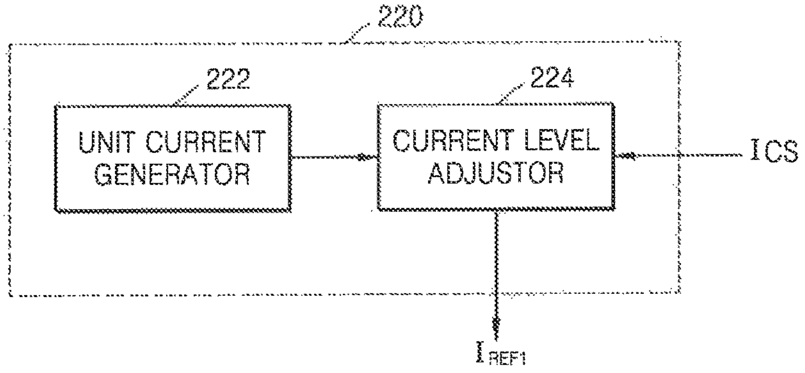
FIG. 2 is a block diagram illustrating a reference current supply unit according to an exemplary embodiment of the inventive concept.

FIG. 2 is a block diagram illustrating a reference current supply unit 220 according to an exemplary embodiment of the inventive concept. Referring to FIG. 2, the reference current supply unit 220 may include a unit current generator 222 and a current level adjustor 224. The unit current generator 222 may generate a unit current for generating a reference current. In an exemplary embodiment of the inventive concept, the unit current generator 222 may supply the unit current to the current level adjustor 224. In an exemplary embodiment of the inventive concept, the unit current generator 222 may supply a bias BIAS, which is used to generate the unit current, to the current level adjustor 224.

The current level adjustor 224 may differently adjust a current level of the temporary reference current $I_{REF1}$ of FIG. 1, based on the current compensation signal ICS, thereby compensating for the temporary reference current $I_{REF1}$.

Figure 3A:
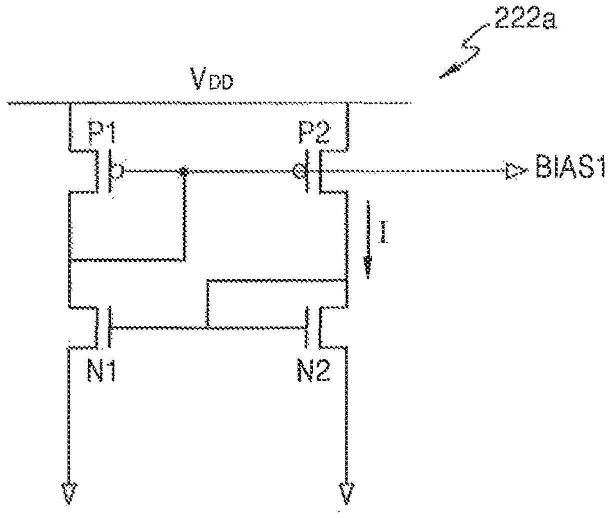
FIGS. 3A, 3B and 3C are circuit diagrams illustrating a reference current supply unit according to an exemplary embodiment of the inventive concept.
Figure 3B:
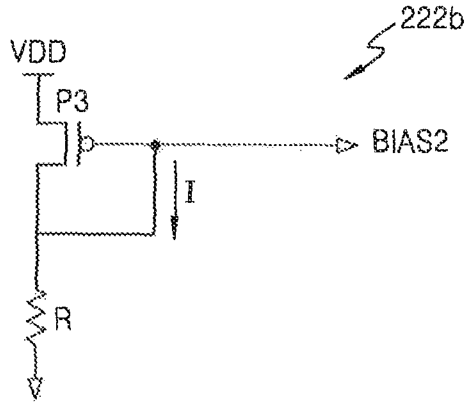
Figure 3C:
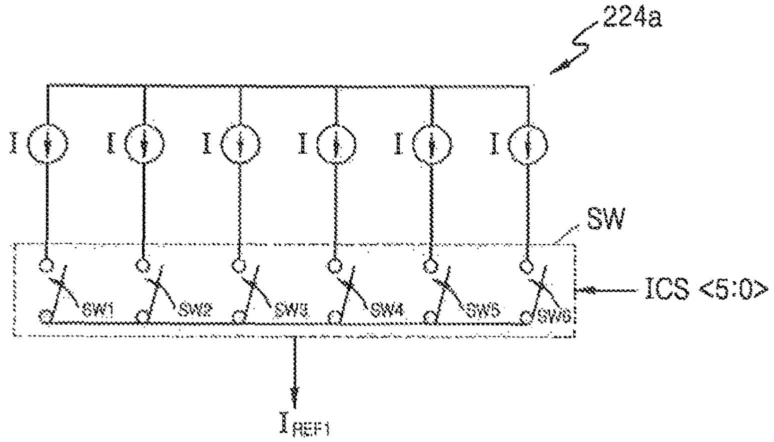

FIGS. 3A and 3B are circuit diagrams illustrating a unit current generator of the reference current supply unit 220 of FIG. 2 according to an exemplary embodiment of the inventive concept, and FIG. 3C is a circuit diagram illustrating a current level adjustor according to an exemplary embodiment of the inventive concept. Referring to FIG. 3A, a unit current generator 222*a* may include two PMOS transistors P1 and P2 and two NMOS transistors N1 and N2. In the present embodiment, the unit current generator 222*a* may include a beta multiplier reference (BMR) circuit which is implemented with a complementary metal-oxide semiconductor (CMOS) transistor. Since the unit current generator 222*a* is implemented with the BMR circuit, a layout area of the current reference circuit including the unit current generator 222*a* is reduced, and the design cost is reduced. The unit current generator 222*a* may supply a bias BIAS1, which is used to generate a unit current I, to the current level adjustor 224. In an exemplary embodiment of the inventive concept, the unit current generator 222*a* may directly supply the unit current I to the current level adjustor 224. It is to be understood that a configuration of the unit current generator 222*a* is not limited to that shown in FIG. 3A. For example, the unit current generator 222*a* may be implemented with various kinds of BMR circuits by variously arranging a plurality of CMOS transistors.

Referring to FIG. 3B, a unit current generator 222*b* may be implemented with one PMOS transistor P3 and one resistor R. The unit current generator 222*b* may be implemented with a circuit which is simpler than the BMR circuit disclosed in FIG. 3A. The unit current generator 222*b* may supply a bias BIAS2, which is used to generate a unit current I, to the current level adjustor 224 of FIG. 2. In an exemplary embodiment of the inventive concept, the unit current generator 222*b* may directly supply the unit current I to the current level adjustor 224.

Referring to FIG. 3C, a current level adjustor 224*a* may include a current source, which supplies a unit current I, and a switch SW. According to an exemplary embodiment of the inventive concept, the current source for supplying the unit current I may be supplied with the unit current I from the unit current generator 222_a_ disclosed in FIG. 3A or the unit current generator 222_b_ disclosed in FIG. 3B. Furthermore, the current source may correspond to a current mirror configured with a transistor and thus may operate as a current source that receives the bias BIAS1 from the unit current generator 222_a_ disclosed in FIG. 3A or the bias BIAS2 from the unit current generator 222_b_ disclosed in FIG. 3B to supply the unit current I.

The current level adjustor 224_a_ may turn on/off the switch SW to adjust a current level of the temporary reference current $I_{REF1}$ which is changed due to the PVT changes, in response to the current compensation signal ICS received from the current compensation unit 140 of FIG. 1. In addition, the current compensation signal ICS may be a digital signal having N bit(s) (where N is a natural number). For example, when the current compensation signal ICS is a 6-bit digital signal and has a value "0 0 0 0 1 1", first to fourth switches SW1 to SW4 may be turned off, and fifth and sixth switches SW5 and SW6 may be turned on, thereby adjusting a current level of the temporary reference current $I_{REF1}$ to 2I.

Moreover, when a target current level of a reference current is 3I and a current level of the temporary reference current $I_{REF1}$ which is obtained based on a change in the reference current caused by the PVT changes is 2I, the current compensation unit 140 of FIG. 1 may supply the current compensation signal ICS corresponding to a value "0 0 0 1 1 1" to the current level adjustor 224_a_, thereby adjusting a current level of the temporary reference current $I_{REF1}$ to 3I. Therefore, the current compensation unit 140 may compensate for the temporary reference current $I_{REF1}$ in order for the temporary reference current $I_{REF1}$ to reach 3I, in other words, a target current level. However, a configuration of the current level adjustor 224_a_ shown in FIG. 3C is not limited thereto. For example, the current level adjustor 224_a_ may be variously implemented.

Figure 4:
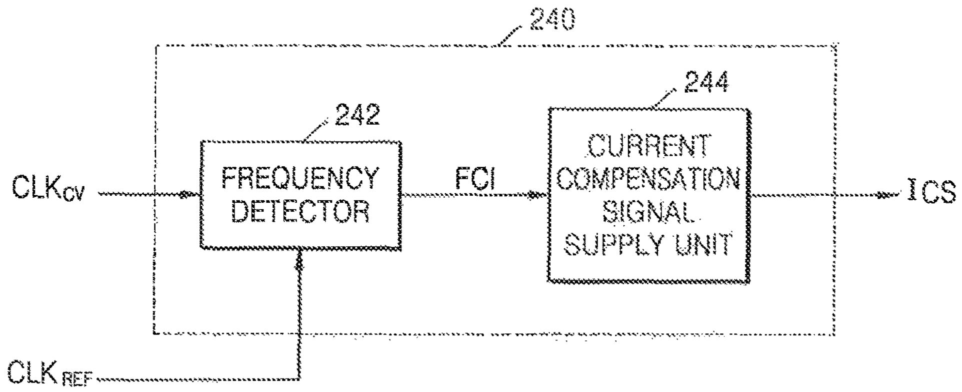
FIG. 4 is a block diagram illustrating a current compensation unit according to an exemplary embodiment of the inventive concept.

FIG. 4 is a block diagram illustrating a current compensation unit 240 according to an exemplary embodiment of the inventive concept. Referring to FIG. 4, the current compensation unit 240 may include a frequency detector 242 and a current compensation signal supply unit 244. The frequency detector 242 may receive a comparison clock signal $CLK_{CV}$ and a reference clock signal $CLK_{REF}$. The frequency detector 242 may detect a frequency of the reference clock signal $CLK_{REF}$ and a frequency of the comparison clock signal $CLK_{CV}$. In an exemplary embodiment of the inventive concept, the frequency detector 242 may detect a frequency of the comparison clock signal $CLK_{CV}$, based on the reference clock signal $CLK_{REF}$. The frequency detector 242 may count the number of rising (or falling) edges of the reference clock signal $CLK_{REF}$ for a certain time to detect a frequency of the reference clock signal $CLK_{REF}$. In addition, the frequency detector 242 may count the number of rising (or falling) edges of the comparison clock signal $CLK_{CV}$ to detect a frequency of the comparison clock signal $CLK_{CV}$. The frequency detector 242 may generate frequency information FCI which includes the detected frequency of the reference clock signal $CLK_{REF}$ and the detected frequency of the comparison clock signal $CLK_{CV}$. The frequency information FCI may be generated as a digital code, and the frequency of the reference clock signal $CLK_{REF}$ and the frequency of the comparison clock signal $CLK_{CV}$ may each correspond to the digital code.

The current compensation signal supply unit 244 may receive the frequency information FCI from the frequency detector 242 and may generate a current compensation signal ICS, based on the frequency information FCI. In an exemplary embodiment of the inventive concept, the current compensation signal supply unit 244 may compare a level of the frequency of the reference clock signal $CLK_{REF}$ and a level of the frequency of the comparison clock signal $CLK_{CV}$ and may generate the current compensation signal ICS, based on a result of the comparison. For example, when a level of the frequency of the comparison clock signal $CLK_{CV}$ is equal to or higher than a reference value, the current compensation signal supply unit 244 may generate the current compensation signal ICS that lowers a current level of the temporary reference current $I_{REF1}$ of FIG. 1. In addition, when a level of the frequency of the comparison clock signal $CLK_{CV}$ is equal to or lower than the reference value, the current compensation signal supply unit 244 may generate the current compensation signal ICS that increases a current level of the temporary reference current $I_{REF1}$ of FIG. 1. The reference value may be equal to the frequency of the reference clock signal $CLK_{REF}$ and may correspond to a certain multiple of a level of the frequency of the reference clock signal $CLK_{REF}$. This will be described below in detail.

Figure 5A:
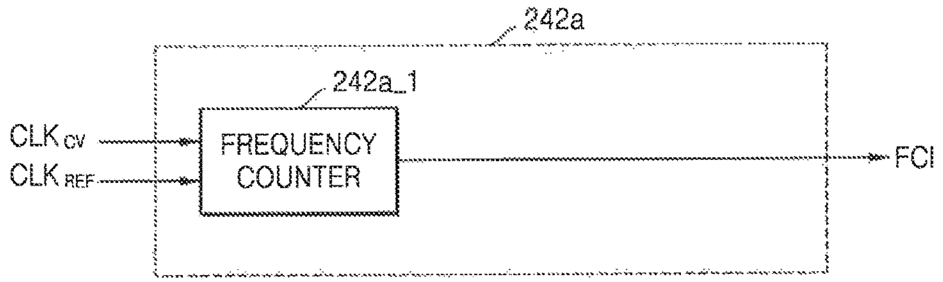
FIGS. 5A and 5D are block diagrams illustrating a frequency detector according to an exemplary embodiment of the inventive concept.
Figure 5B:
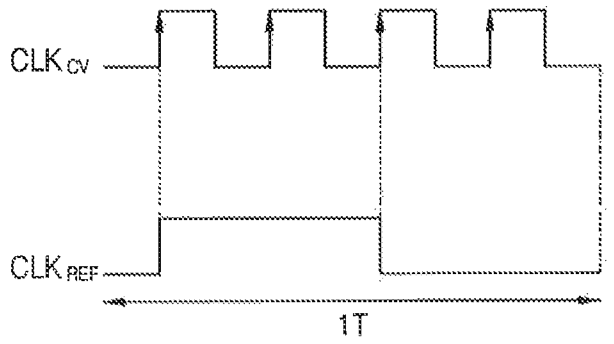
FIGS. 5B, 5C and 5E are diagrams for describing an operation of the frequency detector of FIGS. 5A and 5D according to an exemplary embodiment of the inventive concept.
Figure 5C:
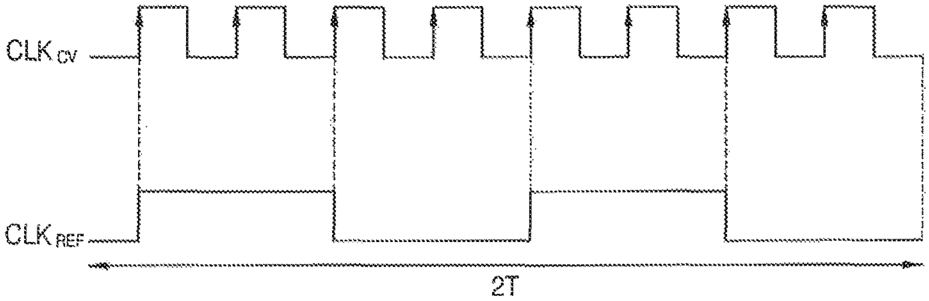
Figure 5D:
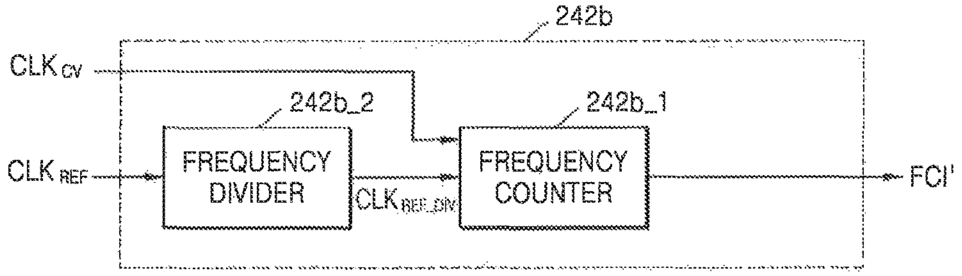
Figure 5E:
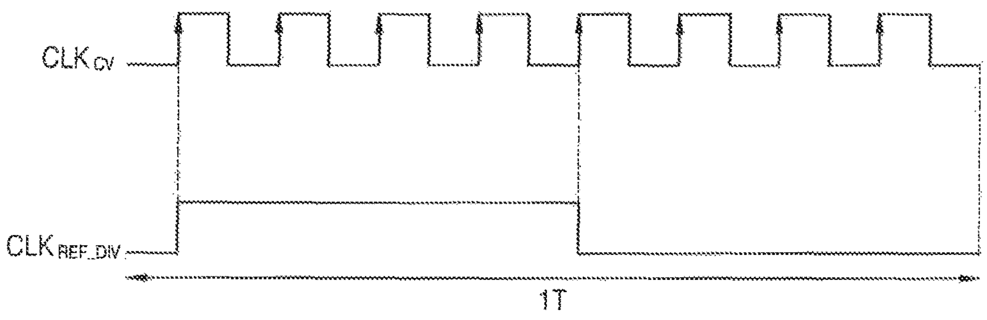

FIGS. 5A and 5D are block diagrams illustrating a frequency detector according to an exemplary embodiment of the inventive concept, and FIGS. 5B, 5C and 5E are diagrams for describing an operation of the frequency detector of FIGS. 5A and 5D according to an exemplary embodiment of the inventive concept. Referring to FIG. 5A, a frequency detector 242_a_ may include a frequency counter 242_a__1. The frequency counter 242_a__1 may count the number of rising edges of a reference clock signal $CLK_{REF}$ for a certain time to detect a frequency of the reference clock signal $CLK_{REF}$. In addition, the frequency counter 242_a__1 may count the number of rising edges of a comparison clock signal $CLK_{CV}$ for a certain time to detect a frequency of the comparison clock signal $CLK_{CV}$. The frequency counter 242_a__1 may generate frequency information FCI which includes the detected frequency of the reference clock signal $CLK_{REF}$ and the detected frequency of the comparison clock signal $CLK_{CV}$. The frequency information FCI may be generated as a digital code, and the frequency of the reference clock signal $CLK_{REF}$ and the frequency of the comparison clock signal $CLK_{CV}$ may each correspond to the digital code.

Referring to FIGS. 5A and 5B, the frequency counter 242_a__1 may set a counting time for counting rising edges of a clock signal. In an exemplary embodiment of the inventive concept, the frequency counter 242_a__1 may set one period 1T of the reference clock signal $CLK_{REF}$ to a counting time and may count rising edges of the reference clock signal $CLK_{REF}$ and rising edges of the comparison clock signal $CLK_{CV}$ for the counting time to detect the frequency of the reference clock signal $CLK_{REF}$ and the frequency of the comparison clock signal $CLK_{CV}$. In addition, referring to FIGS. 5A and 5C, the frequency counter 242_a__1 may set two periods 2T of the reference clock signal $CLK_{REF}$ to a counting time and may count rising edges of the reference clock signal $CLK_{REF}$ and rising edges of the comparison clock signal $CLK_{CV}$ for the counting time to detect the frequency of the reference clock signal $CLK_{REF}$ and the frequency of the comparison clock signal $CLK_{CV}$.

Referring to FIG. 5D, a frequency detector 242_b_ may include a frequency counter 242_b__1 and a frequency divider 242_b__2. The frequency divider 242_b__2 may divide a frequency of a reference clock signal $CLK_{REF}$, and the frequency counter 242_b__1 may count rising edges of a division reference clock signal $CLK_{REF\_DIV}$ having a frequency obtained through the division for a certain time to detect a frequency. The frequency counter 242_b__1 may generate frequency information FCI' which includes the detected frequency of the division reference clock signal $CLK_{REF\_DIV}$ and the frequency of the comparison clock signal $CLK_{CV}$.

Referring to FIGS. 5D and 5E, the frequency divider 242*b*_2 may divide the frequency of the reference clock signal $CLK_{REF}$, and the frequency counter 242*b*_1 may set one period 1T of the division reference clock signal $CLK_{REF\_DIV}$ to a counting time and may count rising edges of the division reference clock signal $CLK_{REF\_DIV}$ and rising edges of the comparison clock signal $CLK_{CV}$ for the counting time to detect the frequency of the division reference clock signal $CLK_{REF\_DIV}$ and the frequency of the comparison clock signal $CLK_{CV}$. As described above, since the frequency detector 242*b* further includes the frequency divider 242*b*2, the frequency detector 242*b* performs an accurate frequency detection operation and also detects a finer change in the frequency of the comparison clock signal $CLK_{CV}$ having the frequency which varies according to a current level of a temporary reference current. In other words, the frequency detector 242*b* performs a precise compensation operation on the temporary reference current, based on the detected frequency change.

Figure 6A:
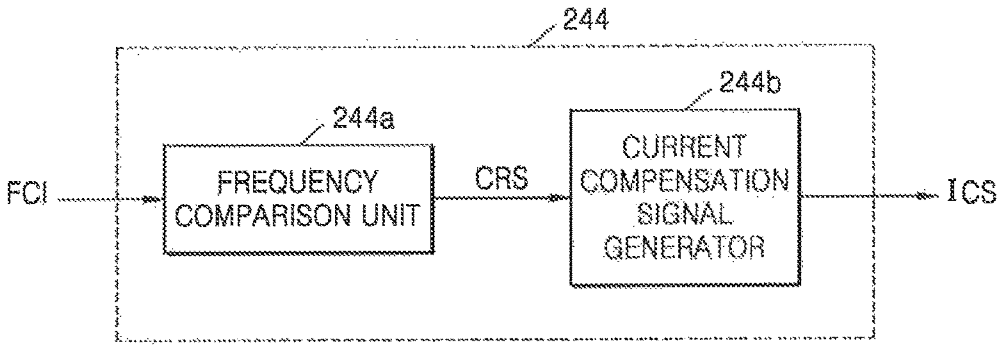
FIGS. 6A and 6B are block diagrams illustrating a current compensation signal supply unit according to an exemplary embodiment of the inventive concept.
Figure 6B:
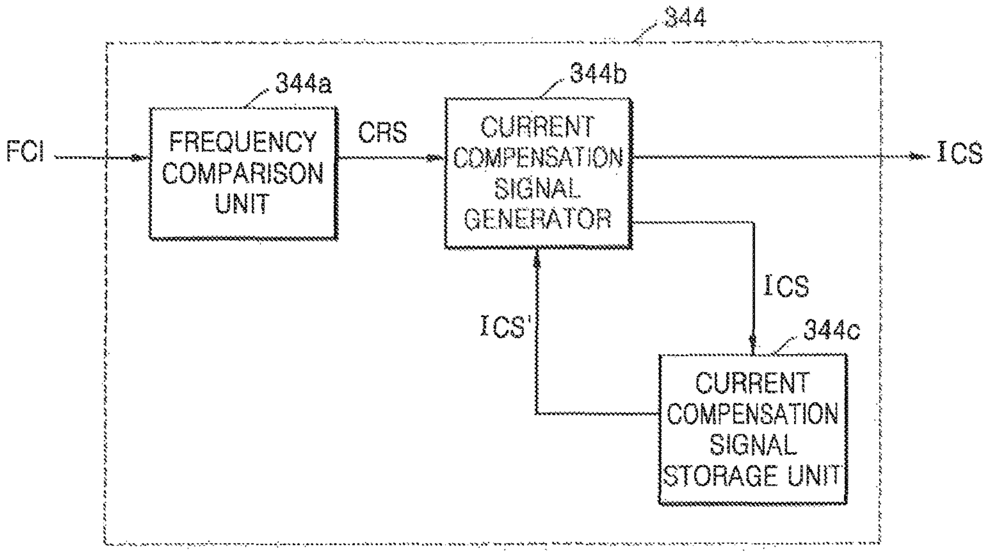

FIGS. 6A and 6B are block diagrams illustrating a current compensation signal supply unit according to an exemplary embodiment of the inventive concept. Referring to FIG. 6A, a current compensation signal supply unit 244 may include a frequency comparison unit 244*a* and a current compensation signal generator 244*b*. The frequency comparison unit 244*a*, as described above, may receive frequency information FCI which includes a frequency of a reference clock signal and a frequency of a comparison clock signal. The frequency comparison unit 244*a* may compare the frequency of the reference clock signal and the frequency of the comparison clock signal. In an exemplary embodiment of the inventive concept, the frequency comparison unit 244*a* may set a certain multiple of a level of the frequency of the reference clock signal to a reference value and may compare a level of the frequency of the reference clock signal with the reference value. The frequency comparison unit 244*a* may generate a comparison signal CRS, based on a result of the comparison. For example, when a level of the frequency of the comparison clock signal is equal to or higher than the reference value, the frequency comparison unit 244*a* may generate the comparison signal CRS corresponding to a high level, and when a level of the frequency of the comparison clock signal is equal to or lower than the reference value, the frequency comparison unit 244*a* may generate the comparison signal CRS corresponding to a low level.

The current compensation signal generator 244*b* may receive the comparison signal CRS and may generate a current compensation signal ICS, based on the comparison signal CRS. In an exemplary embodiment of the inventive concept, when the current compensation signal generator 244*b* receives the comparison signal CRS indicating a case where the frequency of the comparison clock signal is equal to or higher than the reference value, the current compensation signal generator 244*b* may generate the current compensation signal ICS that lowers a current level of the temporary reference current $I_{REF1}$ of FIG. 1. In addition, when the current compensation signal generator 244*b* receives the comparison signal CRS indicating a case where the frequency of the comparison clock signal is equal to or lower than the reference value, the current compensation signal generator 244*b* may generate the current compensation signal ICS that increases a current level of the temporary reference current $I_{REF1}$ of FIG. 1.

Referring to FIG. 6B, a current compensation signal supply unit 344 may include a frequency comparison unit 344*a*, a current compensation signal generator 344*b*, and a current compensation signal storage unit 344*c*. In comparison with the current compensation signal supply unit 244 of FIG. 6A, the current compensation signal supply unit 344 may further include the current compensation signal storage unit 344*c*. The following description will focus on a function of the current compensation signal storage unit 344*c*. The current compensation signal generator 344*b* may generate a current compensation signal ICS, based on a pre-stored current compensation signal ICS' and a compensation signal CRS. The current compensation signal generator 344*b* may store the generated current compensation signal ICS in the current compensation signal storage unit 344*c* and may request the pre-stored current compensation signal ICS' from the current compensation signal storage unit 344*c*. As described above with reference to FIG. 3C, when the current compensation signal ICS is a digital signal and the pre-stored previous current compensation signal ICS' has a value "0 0 0 0 1 1", and when the received comparison signal CRS indicates that a frequency of a comparison clock signal is equal to or lower than a reference value, the current compensation signal generator 344*b* may generate the current compensation signal ICS corresponding to the value "0 0 0 0 1 1" with reference to the previous current compensation signal ICS'. However, when the received comparison signal CRS indicates that the frequency of the comparison clock signal is equal to or higher than the reference value, the current compensation signal generator 344*b* may generate the current compensation signal ICS corresponding to a value "0 0 0 0 0 1" with reference to the previous current compensation signal ICS'.

Figure 7A:
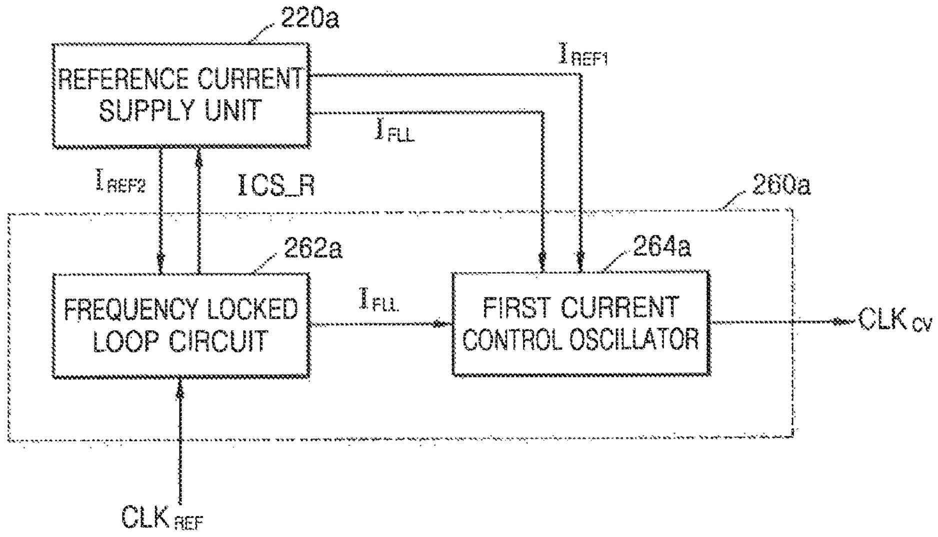
FIGS. 7A and 7B are block diagrams illustrating a current-frequency converter according to an exemplary embodiment of the inventive concept.
Figure 7B:
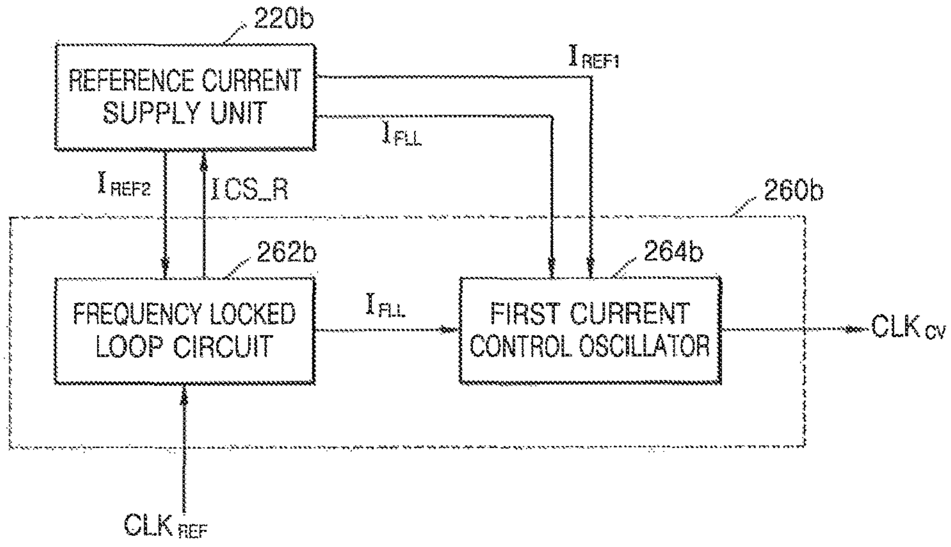

FIGS. 7A and 7B are block diagrams illustrating a current-frequency converter according to an exemplary embodiment of the inventive concept. Referring to FIG. 7A, a current-frequency converter 260*a* may include a frequency locked loop circuit 262*a* and a first current control oscillator 264*a*. However, for convenience of description, a reference current supply unit 220*a* corresponding to the reference current supply unit 120 of FIG. 1 is illustrated in FIG. 7A. The first current control oscillator 264*a* may generate a first comparison clock signal $CLK_{CV}$, based on a first temporary reference current $I_{REF1}$ received from the reference current supply unit 220*a*. For example, the first current control oscillator 264*a* may generate the first comparison clock signal $CLK_{CV}$ having a frequency which varies according to a current level of the first temporary reference current $I_{REF1}$. The first current control oscillator 264*a* may generate the first comparison clock signal $CLK_{CV}$ having the frequency which is controlled by only the first temporary reference current $I_{REF1}$. However, the first current control oscillator 264*a* may be unable to perform an accurate operation due to the PVT changes. For convenience of description, it is illustrated that the frequency locked loop circuit 262*a* directly supplies a frequency locked loop current $I_{FLL}$ to the first current control oscillator 264*b*, but the inventive concept is not limited thereto. For example, the first current control oscillator 264*b* may receive the frequency locked loop current $I_{FLL}$ through another block (e.g., the reference current supply unit 220*a*).

The frequency locked loop circuit 262*a* may perform a frequency locked loop operation at least once in order for the first current control oscillator 264*a* to be controlled by only the first temporary reference current $I_{REF1}$ independently from the PVT changes. The frequency locked loop circuit

262*a* does this by supplying a frequency locked loop current $I_{FLL}$ to the first current control oscillator 264*a*.

Referring to FIG. 7B, a current-frequency converter 260*b* may include a frequency locked loop circuit 262*b* and a first current control oscillator 264*b*. However, for convenience of description, a reference current supply unit 220*b* corresponding to the reference current supply unit 120 of FIG. 1 is illustrated in FIG. 7B. The frequency locked loop circuit 262*b* may receive a second temporary reference current $I_{REF2}$ from the reference current supply unit 220*b*. The reference current supply unit 220*b* may further include a current level adjustor that adjusts a current level of the second temporary reference current $I_{REF2}$, and the current level adjustor may be the same as the current level adjustor 224*a* of FIG. 3C. The frequency locked loop circuit 262*b* may supply a second current compensation signal ICS_R, generated based on the second temporary reference current $I_{REF2}$, to the reference current supply unit 220*b*, thereby performing a frequency locked loop operation. As a result of performing the frequency locked loop operation, the frequency locked loop circuit 262*b* may compensate for the second temporary reference current $I_{REF2}$ to generate the frequency locked loop current $I_{FLL}$ corresponding to a clock signal having a locked target frequency. The frequency locked loop operation will be described in more detail below.

Figure 8:
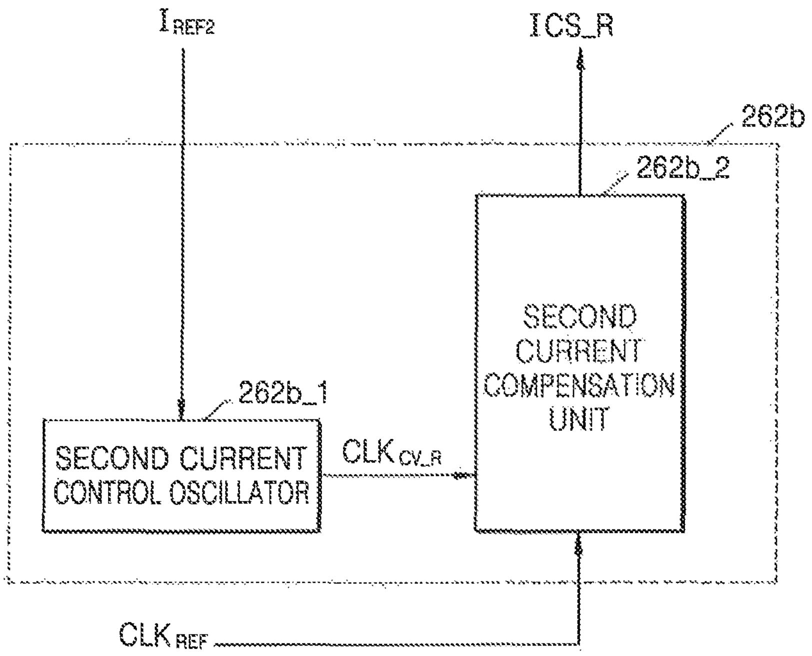
FIG. 8 is a block diagram illustrating a frequency locked loop circuit according to an exemplary embodiment of the inventive concept.

FIG. 8 is a block diagram illustrating the frequency looked loop circuit 262*b* of FIG. 7B according to an exemplary embodiment of the inventive concept. Referring to FIG. 8, the frequency looked loop circuit 262*b* may include a second current control oscillator 262*b*_1 and a second current compensation unit 262*b*_2. The second current control oscillator 262*b*_1 may have the same configuration as that of the first current control oscillator 264*a* of FIG. 7A. The second current control oscillator 262*b*_1 may generate a second comparison clock signal $CLK_{CV\_R}$, based on the second temporary reference current $I_{REF2}$. The second current control oscillator 262*b*_1 may generate the second comparison clock signal $CLK_{CV\_R}$ having a frequency which varies according to a current level of the second temporary reference current $I_{REF2}$. The second current control oscillator 262*b*_1 may supply the generated second comparison clock signal $CLK_{CV\_R}$ to the second current compensation unit 262*b*_2.

The second current compensation unit 262*b*_2 may receive the second comparison clock signal $CLK_{CV\_R}$ from the second current control oscillator 262*b*_1. In an exemplary embodiment of the inventive concept, the second current compensation unit 262*b*_2 may set a locked target frequency, based on the reference clock signal $CLK_{REF}$ received from the outside. For example, the locked target frequency may be set to correspond to a certain multiple of a frequency of the reference clock signal $CLK_{REF}$. The second current compensation unit 262*b*_2 may detect a frequency of the second comparison clock signal $CLK_{CV\_R}$. The second current compensation unit 262*b*_2 may compensate for the second temporary reference current $I_{REF2}$ in order for the second temporary reference current $I_{REF2}$ to become a frequency locked loop current $I_{FLL}$, based on the locked target frequency and the frequency of the second comparison clock signal $CLK_{CV\_R}$.

In an exemplary embodiment of the inventive concept, the second current compensation unit 262*b*_2 may generate a second current compensation signal ICS_R to supply the second current compensation signal ICS_R to the reference current supply unit 220*b* of FIG. 7B, for compensating for the second temporary reference current $I_{REF2}$. In an exemplary embodiment of the inventive concept, the second current compensation unit 262*b*_2 may compare a level of the locked target frequency and a level of a frequency of the second comparison clock signal $CLK_{CV\_R}$ and may generate the second current compensation signal ICS_R, based on a frequency level difference therebetween. According to an exemplary embodiment of the inventive concept, the second current compensation signal ICS_R may be a digital signal.

Figure 9:
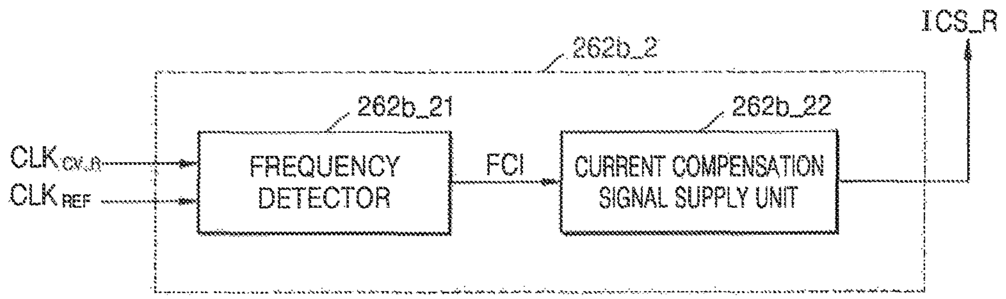
FIG. 9 is a block diagram illustrating a second current compensation unit according to an exemplary embodiment of the inventive concept.

FIG. 9 is a block diagram illustrating the second current compensation unit 262*b*_2 according to an exemplary embodiment of the inventive concept. Referring to FIG. 9, the second current compensation unit 262*b*_2 may include a frequency detector 262*b*_21 and a current compensation signal supply unit 262*b*_22. The frequency detector 262*b*_21 may receive the second comparison clock signal $CLK_{CV\_R}$ and the reference clock signal $CLK_{REF}$. The frequency detector 262*b*_21 may detect a frequency of the second comparison clock signal $CLK_{CV\_R}$ and a frequency of the reference clock signal $CLK_{REF}$. In an exemplary embodiment of the inventive concept, the frequency detector 262*b*_21 may detect the frequency of the second comparison clock signal $CLK_{CV\_R}$, based on the reference clock signal $CLK_{REF}$. The frequency detector 262*b*_21 may count the number of rising edges of the second comparison clock signal $CLK_{CV\_R}$ for a certain time to detect a frequency of the second comparison clock signal $CLK_{CV\_R}$. The frequency detector 262*b*_21 may generate frequency information FCI which includes the detected frequency of the second comparison clock signal $CLK_{CV\_R}$ and a locked target frequency. The frequency information FCI may be generated as a digital code, and the frequency of the second comparison clock signal $CLK_{CV\_R}$ and the locked target frequency may each correspond to the digital code.

The current compensation signal supply unit 262*b*_22 may receive the frequency information FCI from the frequency detector 262*b*_21 and may generate the second current compensation signal ICS_R, based on the received frequency information FCI. In an exemplary embodiment of the inventive concept, the current compensation signal supply unit 262*b*_22 may compare a level of the frequency of the second comparison clock signal $CLK_{CV\_R}$ and a level of the locked target frequency and may generate the second current compensation signal ICS_R, based on a frequency level difference therebetween. For example, when a level of the frequency of the second comparison clock signal $CLK_{CV\_R}$ is equal to or higher than a level of the locked target frequency, the current compensation signal supply unit 262*b*_22 may generate the second current compensation signal ICS_R that lowers a current level of the second temporary reference current $I_{REF2}$ of FIG. 8. In addition, when a level of the frequency of the second comparison clock signal $CLK_{CV\_R}$ is equal to or lower than a level of the locked target frequency, the current compensation signal supply unit 262*b*_22 may generate the second current compensation signal ICS_R that increases a current level of the second temporary reference current $I_{REF2}$ of FIG. 8.

Figure 10A:
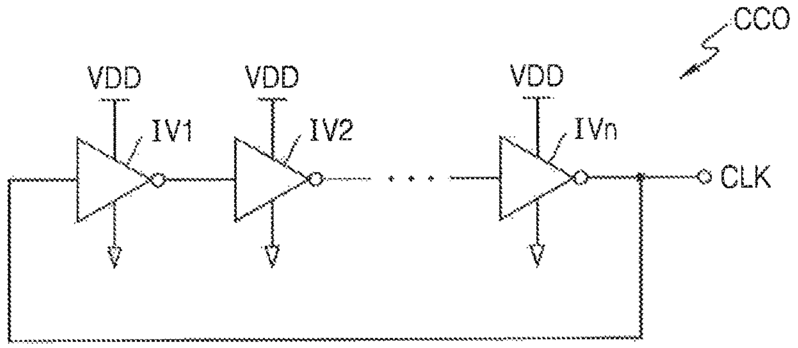
FIGS. 10A and 10B are circuit diagrams illustrating a current control oscillator.
Figure 10B:
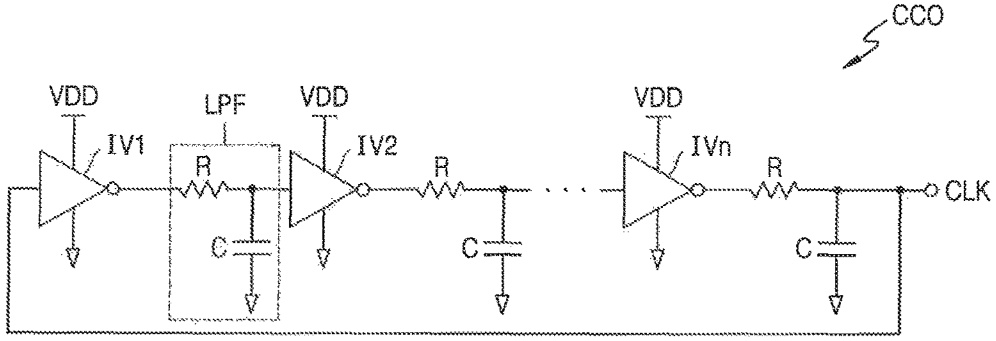

FIGS. 10A and 10B are circuit diagrams illustrating a current control oscillator according to an exemplary embodiment of the inventive concept. Referring to FIG. 10A, a current control oscillator CCO may include a ring oscillator including a plurality of inverters IV1 to IVn which are connected in series. When the current control oscillator CCO receives a current, the current control oscillator CCO may generate and output a clock signal CLK having a frequency corresponding to the current. Referring to FIG. 10B, an RC low pass filter (LPF) may be added into an output terminal of each of the inverters IV1 to IVn and may remove a ripple component included in the clock signal CLK. This way, the clock signal CLK, which has a frequency corresponding to a current, can be more accurately and stably received. The current control oscillator CCO may be an element corresponding to the first current control oscillator 264*a* of FIG. 7 and the second current control oscillator 262*b*_1 of FIG. 8. In addition, by applying a configuration of the current control oscillator CCO, a configuration of the first current control oscillator 264*a* of FIG. 7 may be the same as that of the second current control oscillator 262*b*_1 of FIG. 8. The RC LPF includes a resistor R and a capacitor C connected to the output terminal of each of the inverters IV1 to IVn.

Figure 11:
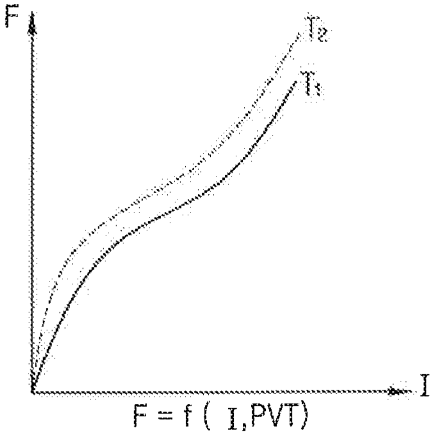
FIG. 11 is a diagram for describing a current-frequency relationship with respect to process, voltage and temperature (PVT) changes in the current control oscillator of FIGS. 10A and 10B.

FIG. 11 is a diagram for describing a current-frequency relationship with respect to PVT changes in the current control oscillator of FIGS. 10A and 10B. Referring to FIG. 11, a current-frequency relationship (a solid line) corresponding to a case where an ambient temperature of the current control oscillator is T1 is shown, and a current-frequency relationship (a dotted line) corresponding to a case where an ambient temperature of the current control oscillator is T2 is shown. Referring to the relationships, it may be seen that an ideal current control oscillator generates a clock signal having a frequency which is controlled by only a current component. However, an actual current control oscillator is affected by a change in a temperature and thus generates a clock signal having a frequency which is changed depending on a level of a temperature. For example, a frequency may be changed due to a process change, a voltage change, and/or the like, in addition to a temperature change. Therefore, a current-frequency function of the actual current control oscillator may be expressed as "F (frequency)=f (I (current), PVT changes)". The current-frequency converter 160 of FIG. 1 may generate a clock signal having a frequency which is controlled by only a received current. Details of this will be described below.

Figure 12:
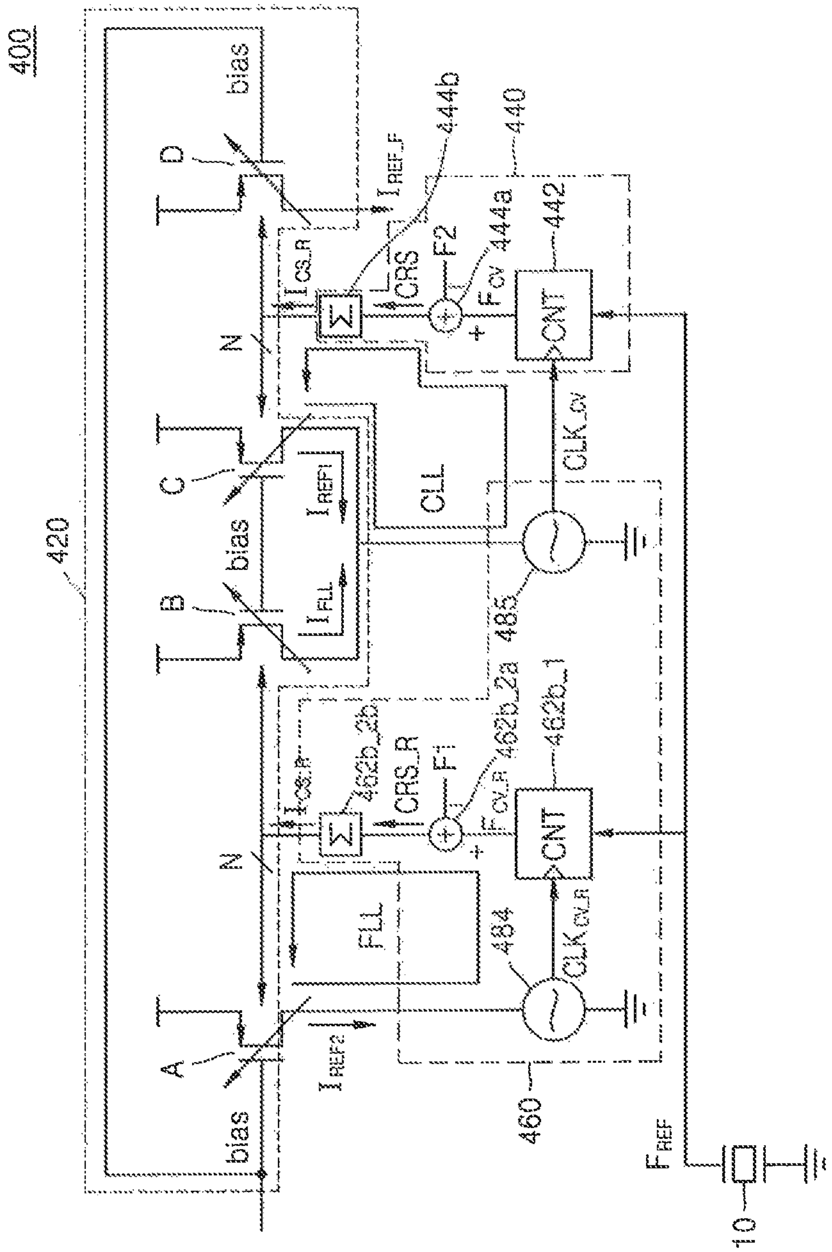
FIG. 12 is a circuit diagram illustrating a current reference circuit according to an exemplary embodiment of the inventive concept.

FIG. 12 is a circuit diagram illustrating a current reference circuit 400 according to an exemplary embodiment of the inventive concept, and FIGS. 13 and 14 are tables for describing an operation of the current reference circuit according to an exemplary embodiment of the inventive concept. Referring to FIG. 12, the current reference circuit 400 may include a reference current supply unit 420, a current-frequency converter 460, and a current compensation unit 440. The reference current supply unit 420 may include first to fourth current level adjustors A to D. The current-frequency converter 460 may include a first current control oscillator 485, a second current control oscillator 484, a frequency counter 462*b*_1, a frequency comparison unit 462*b*_2*a*, and a current compensation signal generator 462*b*_2*b*. The current compensation unit 440 may include a frequency counter 442, a frequency comparison unit 444*a*, and a current compensation signal generator 444*b*. Element 10 in FIG. 12 may correspond to an oscillator that provides a reference frequency $F_{REF}$ to the frequency counter 462*b*_1 and the frequency counter 442.

Referring to FIG. 13, a table for describing performing of a frequency locked loop operation FLL of the current-frequency converter 460 is shown. Referring to FIGS. 3C and 13, a first frequency locked loop operation FLL1 will be described. The current-frequency converter 460 may set a locked target frequency F1 to 100. Hereinafter, a current level of the second reference clock signal $CLK_{REF2}$ is assumed to be 1. The second current control oscillator 484 may receive the second reference clock signal $CLK_{REF2}$ to generate the second comparison clock signal $CLK_{CV\_R}$, and a frequency $F_{CV\_R}$ of the second comparison clock signal $CLK_{CV\_R}$ may be 10. The frequency counter 462*b*_1 may detect the frequency $F_{CV\_R}$ of the second comparison clock signal $CLK_{CV\_R}$, and the frequency comparison unit 462*b*_2*a* may compare the locked target frequency F1 and the frequency $F_{CV\_R}$ of the second comparison clock signal $CLK_{CV\_R}$. Since the frequency $F_{CV\_R}$ of the second comparison clock signal $CLK_{CV\_R}$ is lower than the locked target frequency F1, the second current compensation signal ICS_R having a value "0 0 0 0 1 1" may be supplied to the first current level adjustor A. Referring to FIG. 3C, due to the second current compensation signal ICS_R having a value "0 0 0 0 1 1", the first current level adjustor A may supply the second temporary reference current $I_{REF2}$ having a current level "2I" to the current-frequency converter 460.

To describe a second frequency locked loop operation FLL2, the second current control oscillator 484 may receive the second temporary reference current $I_{REF2}$ having the current level "2I" to generate the second comparison clock signal $CLK_{CV\_R}$, and the frequency $F_{CV\_R}$ of the second comparison clock signal $CLK_{CV\_R}$ may be 40. The frequency counter 462*b*_1 may detect the frequency $F_{CV\_R}$ of the second comparison clock signal $CLK_{CV\_R}$, and the frequency comparison unit 462*b*_2*a* may compare the locked target frequency F1 and the frequency $F_{CV\_R}$ of the second comparison clock signal $CLK_{CV\_R}$. Since the frequency $F_{CV\_R}$ of the second comparison clock signal $CLK_{CV\_R}$ is lower than the locked target frequency F1, the second current compensation signal ICS_R having a value "0 0 1 1 1 1" may be supplied to the first current level adjustor A. Referring to FIG. 3C, due to the second current compensation signal ICS_R having a value "0 0 1 1 1 1", the first current level adjustor A may supply the second temporary reference current $I_{REF2}$ having a current level "4I" to the current-frequency converter 460.

To describe a third frequency locked loop operation FLL3, the second current control oscillator 484 may receive the second temporary reference current $I_{REF2}$ having the current level "4I" to generate the second comparison clock signal $CLK_{CV\_R}$, and the frequency $F_{CV\_R}$ of the second comparison clock signal $CLK_{CV\_R}$ may be 120. The frequency counter 462*b*_1 may detect the frequency $F_{CV\_R}$ of the second comparison clock signal $CLK_{CV\_R}$, and the frequency comparison unit 462*b*_2*a* may compare the locked target frequency F1 and the frequency $F_{CV\_R}$ of the second comparison clock signal $CLK_{CV\_R}$. Since the frequency $F_{CV\_R}$ of the second comparison clock signal $CLK_{CV\_R}$ is higher than the locked target frequency F1, the second current compensation signal ICS_R having a value "0 0 0 1 1 1" may be supplied to the first current level adjustor A. Referring to FIG. 3C, due to the second current compensation signal ICS_R having a value "0 0 0 1 1 1", the first current level adjustor A may supply the second temporary reference current $I_{REF2}$ having a current level "3I" to the current-frequency converter 460.

To describe a fourth frequency locked loop operation FLL4, the second current control oscillator 484 may receive the second temporary reference current $I_{REF2}$ having the current level "3I" to generate the second comparison clock signal $CLK_{CV\_R}$, and the frequency $F_{CV\_R}$ of the second comparison clock signal $CLK_{CV\_R}$ may be 100. The frequency counter 462*b*_1 may detect the frequency $F_{CV\_R}$ of the second comparison clock signal $CLK_{CV\_R}$, and the frequency comparison unit 462*b*2*a* may compare the locked target frequency F1 and the frequency $F_{CV\_R}$ of the second comparison clock signal $CLK_{CV\_R}$. Since the frequency $F_{CV\_R}$ of the second comparison clock signal $CLK_{CV\_R}$ is equal to the locked target frequency F1, the second current compensation signal ICS_R having a value "0 0 0 1 1 1" may be supplied to the first current level adjustor A. A current level of the second temporary reference current $I_{REF2}$, corresponding to a case where the locked target frequency F1 and the frequency $F_{CV\_R}$ of the second comparison clock signal $CLK_{CV\_R}$ have the same value "100", may be equal to that of a frequency locked loop current $I_{FLL}$. The frequency locked loop current $I_{nt}$ may be supplied to the first current control oscillator 485 through the second current level adjustor B.

Referring to FIG. 14, a table for describing a current locked loop operation CLL of the current reference circuit 400 is shown. The first current control oscillator 485 may receive the frequency locked loop current $I_{FLL}$ from the second current level adjustor B, thereby removing component variations of the first current control oscillator 485 caused by the PVT changes. Therefore, the first current control oscillator 485 may generate the first comparison clock signal $CLK_{CV}$ having a frequency which is controlled by only the first temporary reference current $I_{REF1}$.

Referring to FIGS. 3C and 14, when the first comparison clock signal $CLK_{CV}$ generated based on a current corresponding to a sum of the frequency locked loop current $I_{FLL}$ and a reference current having a target current level is assumed to be 200, the current compensation unit 440 may adjust a frequency reference value F2 to 200.

A first current locked loop operation CLL1 will be described. Due to the PVT changes, a current level of the first temporary reference current $I_{REF1}$ is assumed to be 1. The first current control oscillator 485 may receive the first temporary reference current $I_{REF1}$ to generate the first comparison clock signal $CLK_{CV}$, and a frequency $F_{CV}$ of the first comparison clock signal $CLK_{CV}$ may be 110. The frequency counter 442 may detect the frequency $F_{CV}$ of the first comparison clock signal $CLK_{CV}$, and the frequency comparison unit 444*a* may compare a frequency reference value F2 and the frequency $F_{CV}$ of the first comparison clock signal $CLK_{CV}$. Since the frequency $F_{CV}$ of the first comparison clock signal $CLK_{CV}$ is lower than the frequency reference value F2, the first current compensation signal ICS having a value "0 0 0 0 1 1" may be supplied to the third current level adjustor C. Referring to FIG. 3C, due to the first current compensation signal ICS having a value "0 0 0 0 1 1", the third current level adjustor C may supply the first temporary reference current $I_{REF1}$ having a current level "2I" to the first current control oscillator 485.

A second current locked loop operation CLL2 will be described. The first current control oscillator 485 may receive the first temporary reference current $I_{REF1}$ having the current level "2I" to generate the first comparison clock signal $CLK_{CV}$, and the frequency $F_{CV}$ of the first comparison clock signal $CLK_{CV}$ may be 140. The frequency counter 442 may detect the frequency $F_{CV}$ of the first comparison clock signal $CLK_{CV}$, and the frequency comparison unit 444*a* may compare the frequency reference value F2 and the frequency $F_{CV}$ of the first comparison clock signal $CLK_{CV}$. Since the frequency $F_{CV}$ of the first comparison clock signal $CLK_{CV}$ is lower than the frequency reference value F2, the first current compensation signal ICS having a value "0 0 0 1 1 1" may be supplied to the third current level adjustor C. Referring to FIG. 3C, due to the first current compensation signal ICS having a value "0 0 0 1 1 1", the third current level adjustor C may supply the first temporary reference current $I_{REF1}$ having a current level "3I" to the first current control oscillator 485.

A third current locked loop operation CLL3 will be described. The first current control oscillator 485 may receive the first temporary reference current $I_{REF1}$ having the current level "3I" to generate the first comparison clock signal $CLK_{CV}$, and the frequency $F_{CV}$ of the first comparison clock signal $CLK_{CV}$ may be 170. The frequency counter 442 may detect the frequency $F_{CV}$ of the first comparison clock signal $CLK_{CV}$, and the frequency comparison unit 444*a* may compare the frequency reference value F2 and the frequency $F_{CV}$ of the first comparison clock signal $CLK_{CV}$. Since the frequency $F_{CV}$ of the first comparison clock signal $CLK_{CV}$ is lower than the frequency reference value F2, the first current compensation signal ICS having a value "0 0 1 1 1 1" may be supplied to the third current level adjustor C. Referring to FIG. 3C, due to the first current compensation signal ICS having a value "0 0 1 1 1 1", the third current level adjustor C may supply the first temporary reference current $I_{REF1}$ having a current level "4I" to the first current control oscillator 485.

A fourth current locked loop operation CLL4 will be described. The first current control oscillator 485 may receive the first temporary reference current $I_{REF1}$ having the current level "4I" to generate the first comparison clock signal $CLK_{CV}$, and the frequency $F_{CV}$ of the first comparison clock signal $CLK_{CV}$ may be 200. The frequency counter 442 may detect the frequency $F_{CV}$ of the first comparison clock signal $CLK_{CV}$, and the frequency comparison unit 444*a* may compare the frequency reference value F2 and the frequency $F_{CV}$ of the first comparison clock signal $CLK_{CV}$. Since the frequency $F_{CV}$ of the first comparison clock signal $CLK_{CV}$ is equal to the frequency reference value F2, 4I that is a current level of the first temporary reference current $I_{REF1}$ may correspond to a target current level. Therefore, the first current compensation signal ICS having a value "0 0 1 1 1 1" may be supplied to the fourth current level adjustor D. The fourth current level adjustor D may supply a reference current $I_{REF\_F}$, having the current level "4I" that is the target current level, to other function blocks.

Due to a configuration and an operation of the current reference circuit 400, the reference current $I_{REF\_F}$ having a constant current level may be supplied despite the PVT changes.

Figure 15:
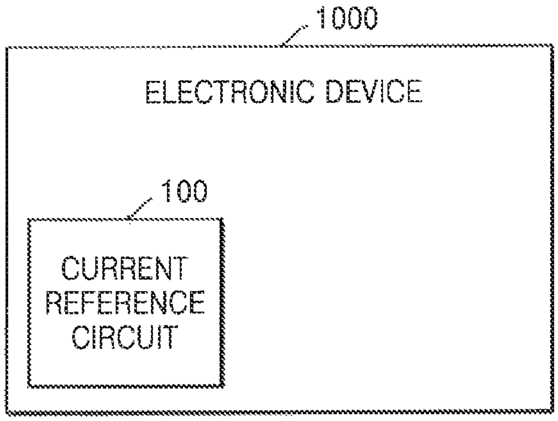
FIG. 15 is a diagram illustrating an electronic device including a current reference circuit according to an exemplary embodiment of the inventive concept.

FIG. 15 is a diagram illustrating an electronic device 1000 including the current reference circuit 100 according to an exemplary embodiment of the inventive concept. Referring to FIG. 15, by using the current reference circuit 100, the electronic device 1000 may supply a reference current, which has a constant current level despite the PVT changes, to a plurality of function blocks. Clocks respectively applied to the function blocks may differ or may be the same. Each of the function blocks of the electronic device 1000 may operate in synchronization with a clock supplied thereto. The electronic device 1000 may be one of various electronic devices such as televisions (TVs), smartphones, tablet personal computers (PCs), and/or the like. Accordingly, in the electronic device 1000 according to an exemplary embodiment of the inventive concept, despite a small area, an accurate and stable frequency is generated, and an accurate and stable operation is performed.

An exemplary embodiment of the inventive concept provides a current reference circuit and an electronic device including the same, which compensate for a temporary reference current to cause a reference current to reach a target current level, thereby generating a reference current having the target current level. The generated reference current is then insensitive to factors such as PVT changes.

While the inventive concept has been particularly shown and described with reference to exemplary embodiments thereof, it will be understood that various changes in form and details may be made therein without departing from the spirit and scope of the inventive concept as defined by the following claims.

What is claimed is:

1. A current reference circuit, comprising:

a reference current supply unit configured to generate a reference current having a target current level;

a current-frequency converter configured to receive a first temporary reference current corresponding to the reference current from the reference current supply unit and to generate a first comparison clock signal, in response to the first temporary reference current; and a first current compensation unit configured to generate a first current compensation signal used for the first temporary reference current to reach the target current level, in response to a frequency of a reference clock signal and a frequency of the first comparison clock signal, wherein the reference current supply unit comprises:

a unit current generator configured to generate a unit current for generating the reference current; and a current level adjustor configured to receive the first current compensation signal from the first current compensation unit and to adjust a current level of the first temporary reference current, in response to the first current compensation signal.

2. The current reference circuit of claim 1, wherein the unit current generator comprises a beta multiplier reference (BMR) circuit including a complementary metal-oxide semiconductor (CMOS) transistor.

3. The current reference circuit of claim 1, wherein the first current compensation unit comprises:

a first frequency detector configured to detect the frequency of the first comparison clock signal and the frequency of the reference clock signal; and a first current compensation supply unit configured to compare a level of the frequency of the first comparison clock signal and a level of the frequency of the reference clock signal and to generate the first current compensation signal in response to a result of the comparison.

4. The current reference circuit of claim 3, wherein the first frequency detector comprises a frequency divider configured to divide the frequency of the reference clock signal.

5. The current reference circuit of claim 3, wherein the first current compensation signal supply unit comprises:

a first frequency comparison unit configured to generate a first comparison signal in response to the comparison result; and a first current compensation signal generator configured to generate the first current compensation signal in response to the first comparison signal.

6. The current reference circuit of claim 1, wherein the first temporary reference current corresponds to a current which is obtained through a change in the reference current caused by a process, voltage, or temperature (PVT) change, and a current level of the reference current differs from a current level of the first temporary reference current.

7. A current reference circuit, comprising:

a reference current supply unit configured to generate a reference current having a target current level;

a current-frequency converter configured to receive a first temporary reference current corresponding to the reference current from the reference current supply unit and to generate a first comparison clock signal, in response to the first temporary reference current; and a first current compensation unit configured to generate a first current compensation signal used for the first temporary reference current to reach the target current level, in response to a frequency of a reference clock signal and a frequency of the first comparison clock signal, wherein the current-frequency converter comprises:

a frequency locked loop circuit configured to receive a second temporary reference current from the reference current supply unit and generate a frequency locked loop current corresponding to a clock signal having a locked target frequency; and a first current control oscillator configured to obtain a third temporary reference current by summing the frequency locked loop current and the first temporary reference current and to generate the first comparison clock signal corresponding to the third temporary reference current.

8. The current reference circuit of claim 7, wherein the frequency locked loop circuit comprises:

a second current control oscillator configured to receive the second temporary reference current and to generate a second comparison clock signal corresponding to the second temporary reference current; and a second current compensation unit configured to receive the reference clock signal and the second comparison clock signal and generate a second current compensation signal in response to the frequency of the reference clock signal and a frequency of the second comparison clock signal.

9. The current reference circuit of claim 8, wherein the second current compensation unit comprises:

a second frequency detector configured to detect the frequency of the second comparison clock signal and the frequency of the reference clock signal; and a second current compensation supply unit configured to compare a level of the frequency of the second comparison clock signal and a level of the frequency of the reference clock signal and to generate the second current compensation signal in response to a result of the comparison.

10. The current reference circuit of claim 8, wherein a circuit configuration of the first current control oscillator is the same as a circuit configuration of the second current control oscillator.

11. An electronic device, comprising:

a current reference circuit configured to perform at least one-time current locked loop operation of generating a comparison clock signal based on a temporary reference current and compensating for the temporary reference current by using a frequency of a reference clock signal and a frequency of the comparison clock signal, and generating a reference current corresponding to the compensated temporary reference current; and a function block configured to operate based on the reference current, wherein the current reference circuit comprises a frequency locked loop circuit configured to generate a frequency locked loop current, and a current control oscillator configured to generate the comparison clock signal by summing the frequency locked loop current and the temporary reference current, wherein the frequency locked loop current is directly provided to the current control oscillator from the frequency locked loop circuit, wherein the current reference circuit further comprises:

a unit current generator configured to generate a unit current for generating the reference current; and a current level adjustor configured to adjust a current level of the temporary reference current, in response to a current compensation signal.

12. The electronic device of claim 11, wherein the reference clock signal is received from a crystal oscillator.

13. The electronic device of claim 11, wherein the current reference circuit further comprises a current compensation unit configured to compare a level of a frequency of the reference clock signal and a level of a frequency of the comparison clock signal and to generate the current compensation signal, which is used to compensate for the temporary reference current, based on a result of the comparison.

14. A current reference circuit, comprising:

a reference current supply circuit configured to output a reference current and a temporary reference current;

a current-frequency converter configured to receive the temporary reference current and a generate a comparison clock signal; and a current compensating circuit configured to receive the comparison clock signal and a reference clock signal, generate a current compensation signal and provide the current compensation signal to the reference current supply circuit, wherein the reference current supply circuit includes:

a unit current generator configured to generate a unit current for generating the reference current; and a current level adjustor configured to receive the current compensation signal from the current compensating circuit and to adjust a current level of the temporary reference current, in response to the current compensation signal.

15. The current reference circuit of claim 14, wherein the comparison clock signal has a frequency that is controlled according only to a current level of the temporary reference current.

16. The current reference circuit of claim 14, wherein the current compensation circuit compensates for the temporary reference current to become the reference current based on a frequency of the reference clock signal and a frequency of the comparison clock signal.

17. The current reference circuit of claim 14, wherein the reference current has a constant current level.

18. The current reference circuit of claim 14, wherein the current reference circuit is configured to perform a current locked loop operation at least once for the temporary reference current to reach a target level.

* * * * *